(12) United States Patent
Hahto et al.

(10) Patent No.: US 11,017,974 B2
(45) Date of Patent: May 25, 2021

(54) ION SOURCE

(71) Applicant: Nissin Ion Equipment Co., Ltd., Minami-Ku-Kyoto (JP)

(72) Inventors: Sami K. Hahto, Nashua, NH (US); George Sacco, Topsfield, MA (US)

(73) Assignee: Nissin Ion Equipment Co., Ltd., Kyoto (JP)

( * ) Notice: Subject to any disclaimer, the term of this patent is extended or adjusted under 35 U.S.C. 154(b) by 290 days.

(21) Appl. No.: 15/795,586

(22) Filed: Oct. 27, 2017

(65) Prior Publication Data

US 2018/0138008 A1 May 17, 2018

Related U.S. Application Data

(60) Provisional application No. 62/420,889, filed on Nov. 11, 2016.

(51) Int. Cl.
*H01J 37/08* (2006.01)
*H01J 37/317* (2006.01)
(Continued)

(52) U.S. Cl.
CPC ............ *H01J 27/024* (2013.01); *H01J 37/05* (2013.01); *H01J 37/08* (2013.01);
(Continued)

(58) Field of Classification Search
None
See application file for complete search history.

(56) References Cited

U.S. PATENT DOCUMENTS 2,712,074 A   6/1955   Neil
2,890,337 A * 6/1959   Backus .................. H01J 49/10
                                                            250/426
(Continued)

FOREIGN PATENT DOCUMENTS

EP     0722180 A2    7/1996
GB     2070853 A     9/1981
(Continued)

OTHER PUBLICATIONS

Mancesteretal, "Doping of silicon by ion implantation" Nuclear instruments and Methods (Year: 1965).*

(Continued)

*Primary Examiner* — Michael J Logie
(74) *Attorney, Agent, or Firm* — Proskauer Rose LLP

(57) ABSTRACT

An ion source is provided that includes a gas source for supplying a gas, and an ionization chamber defining a longitudinal axis extending therethrough and including an exit aperture along a side wall of the ionization chamber. The ion source also includes one or more extraction electrodes at the exit aperture of the ionization chamber for extracting ions from the ionization chamber in the form of an ion beam. At least one of the extraction electrodes comprises a set of discrete rods forming a plurality of slits in the at least one extraction electrode for enabling at least one of increasing a current of the ion beam or controlling an angle of extraction of the ion beam from the ionization chamber. Each rod in the set of discrete rods is parallel to the longitudinal axis of the ionization chamber.

19 Claims, 10 Drawing Sheets

(51) Int. Cl.
*H01J 27/02* (2006.01)
*H01J 37/05* (2006.01)

(52) U.S. Cl.
CPC ..... *H01J 37/3171* (2013.01); *H01J 2237/057* (2013.01); *H01J 2237/06375* (2013.01); *H01J 2237/08* (2013.01); *H01J 2237/082* (2013.01); *H01J 2237/14* (2013.01)

(56) References Cited

U.S. PATENT DOCUMENTS

| | | | |
|---|---|---|---|
| 2,919,175 | A | 12/1959 | Kilner |
| 3,908,123 | A * | 9/1975 | Veach ............... H01J 49/06 250/281 |
| 4,412,153 | A | 10/1983 | Kalbfus |
| 4,847,504 | A * | 7/1989 | Aitken ............... H01J 27/022 250/423 R |
| 5,554,853 | A | 9/1996 | Rose |
| 5,920,076 | A * | 7/1999 | Burgin ............... H01J 27/022 250/423 R |
| 6,016,036 | A * | 1/2000 | Brailove ............ H01J 27/024 250/423 R |
| 6,331,713 | B1 * | 12/2001 | Smick ............... H01J 27/08 250/423 R |
| 6,403,967 | B1 * | 6/2002 | Chen ................. H01J 37/05 250/281 |
| 6,885,014 | B2 | 4/2005 | Benveniste |
| 7,598,505 | B2 * | 10/2009 | Benveniste ........ H01J 37/3171 250/492.1 |
| 7,635,850 | B2 | 12/2009 | Yamashita et al. |
| 8,723,135 | B2 | 5/2014 | Glavish et al. |
| 8,994,272 | B2 | 3/2015 | Horsky et al. |
| 9,142,386 | B2 | 9/2015 | Hahto et al. |
| 2002/0043621 | A1 * | 4/2002 | Aitken ............... H01J 37/05 250/281 |
| 2003/0122090 | A1 | 7/2003 | Tsukihara et al. |
| 2005/0258380 | A1 | 11/2005 | White et al. |
| 2006/0152164 | A1 * | 7/2006 | Lee ................... H01J 27/024 315/111.31 |
| 2007/0089833 | A1 | 4/2007 | Inouchi et al. |
| 2008/0164427 | A1 * | 7/2008 | Collart .............. H01J 37/3171 250/492.21 |
| 2009/0206270 | A1 * | 8/2009 | Glavish ............. H01J 37/05 250/396 ML |
| 2013/0105705 | A1 * | 5/2013 | Inouchi ............. H01J 27/024 250/423 R |
| 2016/0005570 | A1 | 1/2016 | Hahto et al. |
| 2017/0110282 | A1 | 4/2017 | White |

FOREIGN PATENT DOCUMENTS

| | | | | |
|---|---|---|---|---|
| GB | 2332087 | A * | 6/1999 | ............ H01J 27/14 |
| GB | 2332087 | A | 9/1999 | |
| JP | H03230463 | A | 10/1991 | |
| JP | 2004-139944 | A | 5/2004 | |
| JP | 2013-097958 | A | 5/2013 | |
| JP | 2013097958 | A * | 5/2013 | ............ H01J 37/08 |

OTHER PUBLICATIONS

Aitken, "a technique for the production of multiple, large, mass analyzsed ribbon beams" IEEE (Year: 1999).*
Wang, CN103681191, retrieved from Espacenet (Year: 2014).*
Wang CN 103681191, machine translation, retreived from Espacenet (Year: 2014).*
Inouchi et al., "Multi-cusp Ion Source for Gen 5.5 Doping system", Ion Implantation Technology (Year: 2012).*
Inouchi et al., "Increase of Boron Ion Beam Current Extracted from a Multi-cusp Ion source in an Ion doping System with Mass separation", Ion Implantation Technology (Year: 2008).*
Cherekdjian et al., "Nissin Ion Doping System—H2+ Implantation for silicon Layer Exfoliation" Ion implantation Technology (Year: 2010).*

* cited by examiner

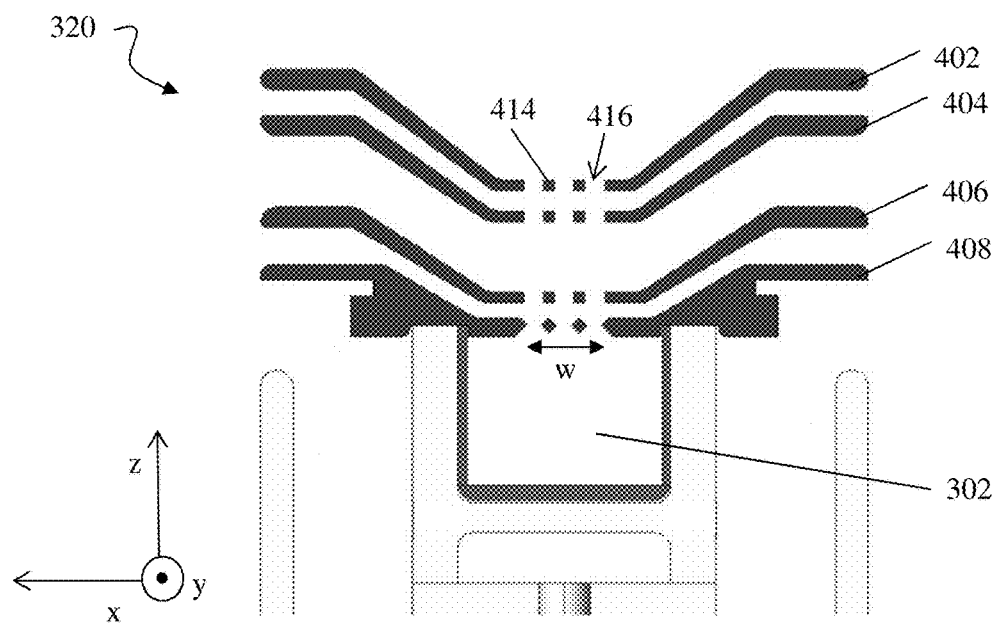
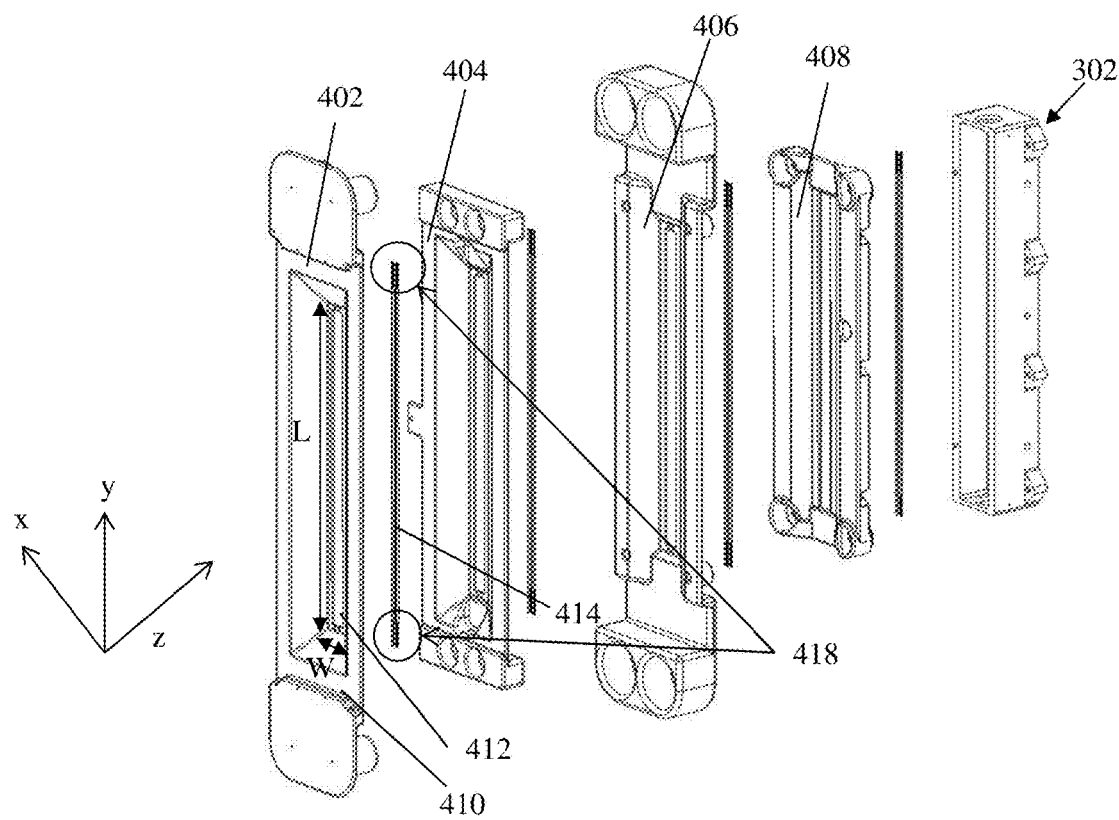
FIG. 4a
FIG. 4b

ION SOURCE

This application claims priority to and benefit of U.S. Provisional Patent Application Ser. No. 62/420,889, filed on Nov. 11, 2016, which is owned by the assignee of the instant application and incorporated herein by reference in its entirety.

FIELD OF THE INVENTION

The invention relates generally to ion sources, and more particularly, to ion sources adapted to generate an ion beam that has low energy and high dosage.

BACKGROUND OF THE INVENTION

Ion implantation has been a critical technology in semiconductor device manufacturing and is currently used for many processes including fabrication of the p-n junctions in transistors, particularly for CMOS devices such as memory and logic chips. By creating positively-charged ions containing the dopant elements required for fabricating the transistors in silicon substrates, the ion implanters can selectively control both the energy (hence implantation depth) and ion current (hence dose) introduced into the transistor structures.

FIG. 1 illustrates a conventional, prior art ion implanter 100. In operation, the plasma ions generated in the ion source 110 can be extracted by electrostatic optics (not shown) to generate an energetic ion beam 112 ranging in energy from a few keV to about 100 keV. The ion beam 112 is transported and focused by a mass analyzing magnet 120 that is positioned downstream from and external to the ion source 110. The mass analyzing magnet 120 is configured to spatially separate or disperse ion species according to their mass-to-charge ratio. Once spatially separated, the ion beam 112 is blocked by a mass resolving aperture (MRA) or mass resolving slit (MRS) 122 that is downstream from and external to the mass analyzing magnet 120. The MRS 122 includes an elongated slot, such that only ions which are not blocked by this slot are transmitted downstream in the implanter, where the ion beam 112 is accelerated to a desired energy by the accelerator 124 and ultimately impinges on a workpiece 126 for implantation by the selected ions. The workpiece 126 can be located within a target chamber 128. A shortcoming associated with such a conventional ion implanter 100 is that it has a relatively large size (i.e., footprint), thus requiring a sizeable facility to operate. In addition, the ion implanter 100 cannot achieve high-dose implantation, such as 1 keV E16, at practical throughput. Even though some of today's ion implantation systems can theoretically reach this high dose, these systems require pure species and pure energy, which are impractical to implement. Therefore, there is a need for an improved ion implanter with a more compact design and capable of producing a relatively low-energy and high-dosage ion beam profile.

SUMMARY OF THE INVENTION

In some embodiments, the present invention provides an improved ion implanter with an ion source positioned and installed inside of a mass analyzing magnet, where the magnetic field of the mass analyzer magnet is used to generate plasma in the ion source. In some embodiments, a mass resolving slit is also installed inside of the mass analyzing magnet. The present invention further provides an improved ion source capable of generating a ribbon beam with high current and controllable angle of ion beam extraction. Thus, systems of the present invention are capable of generating shortened ion beams that can transport higher beam current in comparison to conventional ion implanters (e.g., the ion implanter 100 of FIG. 1).

In one aspect, an ion implanter is provided. The ion implanter includes an ion source configured to generate an ion beam and an analyzer magnet defining a chamber having a magnetic field therein. The chamber provides a curved path between a first end and a second end of the chamber. The ion source is disposed within the chamber of the analyzer magnet adjacent to the first end. The analyzer magnet is configured to bend the ion beam from the ion source within the chamber along the curved path to spatially separate one or more ion species in the ion beam while the ion source is immersed in the magnetic field of the analyzer magnet.

In some embodiments, the ion source of the ion implanter comprises one or more extraction electrodes disposed in the chamber of the analyzer magnet for extracting the ion beam from the ion source. At least one of the extraction electrodes comprises a set of discrete rods forming a plurality of slits in the at least one extraction electrode.

In some embodiments, the chamber of the analyzer magnet comprises a top wall, a bottom wall and a plurality of side walls. Each of the top, bottom and side walls extends between the first end and the second end to cooperatively define the curved path. At least one of the top, bottom or side walls of the chamber can comprise a port configured to receive the ion source for installation within the analyzer magnet.

In another aspect, an ion source is provided. The ion source includes a gas source for supplying a gas and an ionization chamber defining a longitudinal axis extending therethrough and including an exit aperture along a side wall of the ionization chamber. The ionization chamber is adapted to form a plasma from the gas. The plasma generates a plurality of ions. The ion source also includes one or more extraction electrodes at the exit aperture of the ionization chamber for extracting the plurality of ions from the ionization chamber in the form of an ion beam. At least one of the extraction electrodes comprises a set of discrete rods forming a plurality of slits in the at least one extraction electrode for enabling at least one of increasing a current of the ion beam or controlling an angle of extraction of the ion beam from the ionization chamber. Each rod in the set of discrete rods is parallel to the longitudinal axis of the ionization chamber. The ionization chamber can be elongated and the longitudinal axis can extend along an elongated length of the ionization chamber.

In some embodiments, the ion beam of the ion source is provided to an analyzer magnet comprising a chamber that defines a curved path between a first end and a second end. The ion source can be located external to the analyzer magnet adjacent to the first end. In some embodiments, a magnetic focusing lens is disposed outside of the chamber of the analyzer magnet adjacent to the second end. In some embodiments, a second magnetic focusing lens is disposed outside of the chamber of the analyzer magnet adjacent to the first end. In some embodiments, a mass resolving slit is located between the first magnetic focusing lens and the second magnetic focusing lens.

Any of the above aspects can include one or more of the following features. In some embodiments, one end of each rod in the set of discrete rods for the at least one extraction electrode can be fixed and another end of each rod in the set of discrete rods can be slideable. In some embodiments, a cross section of each of the rods is square. In some embodiments, the one or more extraction electrodes include a plasma electrode. The cross section of each rod in the set of discrete rods for the plasma electrode is situated at an angle relative to the cross section of each rod in a set of discrete rods for another extraction electrode. The angle can be about 45 degrees In some embodiments, at least one of the one or more extraction electrodes is configured to physically contact a conductive elastic member connected to the chamber of the analyzer magnet, the conductive elastic member configured to set a voltage of the at least one electrode. The at least one electrode can be a suppression electrode or a puller electrode.

In some embodiments, at least one of the one or more extraction electrodes is configured to physically contact a conductive rod connected to the chamber of the analyzer magnet. The conductive rod is configured to set a voltage of the at least one electrode. The at least one electrode can be a suppression electrode or a puller electrode. In some embodiments, a first end of the conductive rod is in physical contact with the at least one electrode and a second end of the conductive rod is in communication with a spring assembly configured to adjust a position of the at least one electrode by imparting a force on the at least one electrode via the conductive rod.

In some embodiments, the ion implanter further comprises a mass resolving slit disposed inside of the chamber of the analyzer magnet adjacent to the second end. In some embodiments, the ion implanter further comprises a magnetic focusing lens having at least a portion disposed outside of the chamber of the analyzer magnet. The magnetic focusing lens is configured to focus, defocus or wiggle the ion beam in a non-dispersive plane after the ion beam passes through the mass resolving slit.

In some embodiments, the magnetic focusing lens comprises an upper zone having a pair of upper magnetic coils and a lower zone having a pair of lower magnetic coils. In some embodiments, the chamber of the analyzer magnet defines a curved central beam axis, and widths of the chamber perpendicular to the curved central beam axis vary along the curved central beam axis such that a width of the first end is larger than a width of the second end. The magnetic focusing lens is located adjacent to the narrower second end. In some embodiments, at least one of applied current or a magnetic field direction of the pair of upper magnetic coils or the pair of lower magnetic coils is adjustable to provide the focus, defocus or wiggle function.

Other aspects and advantages of the present invention will become apparent from the following detailed description, taken in conjunction with the accompanying drawings, illustrating the principles of the invention by way of example only.

BRIEF DESCRIPTION OF THE DRAWINGS

The advantages of the technology described above, together with further advantages, may be better understood by referring to the following description taken in conjunction with the accompanying drawings. The drawings are not necessarily to scale, emphasis instead generally being placed upon illustrating the principles of the technology.

FIGS. 4a and 4b show a top view and a profile view, respectively, of an exemplary configuration of the extraction system of the ion source of FIGS. 2a and 2b, according to some embodiments of the present invention.

DESCRIPTION OF THE INVENTION

Figure 2A:
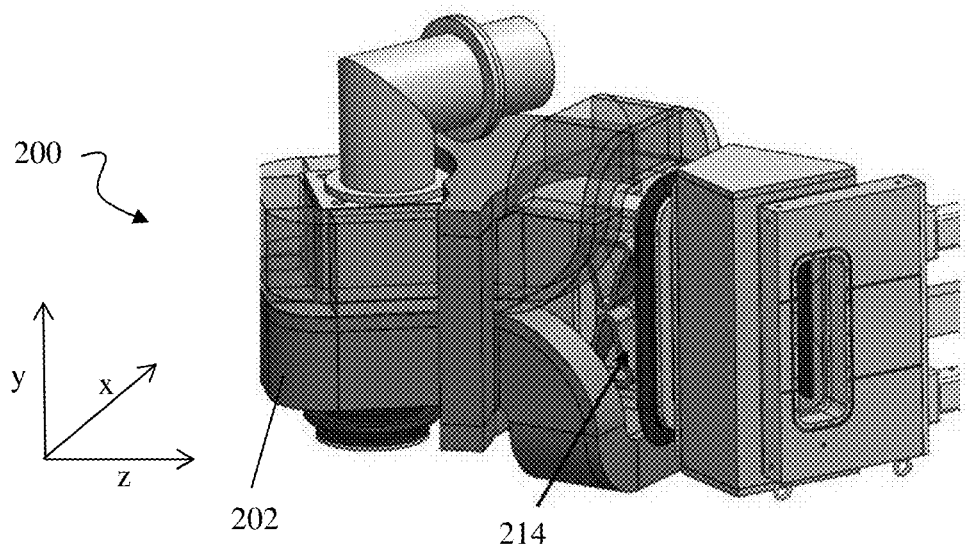
FIGS. 2a and 2b show a perspective view and a top view, respectively, of a portion of an exemplary ion implanter, according to some embodiments of the present invention.
Figure 2B:
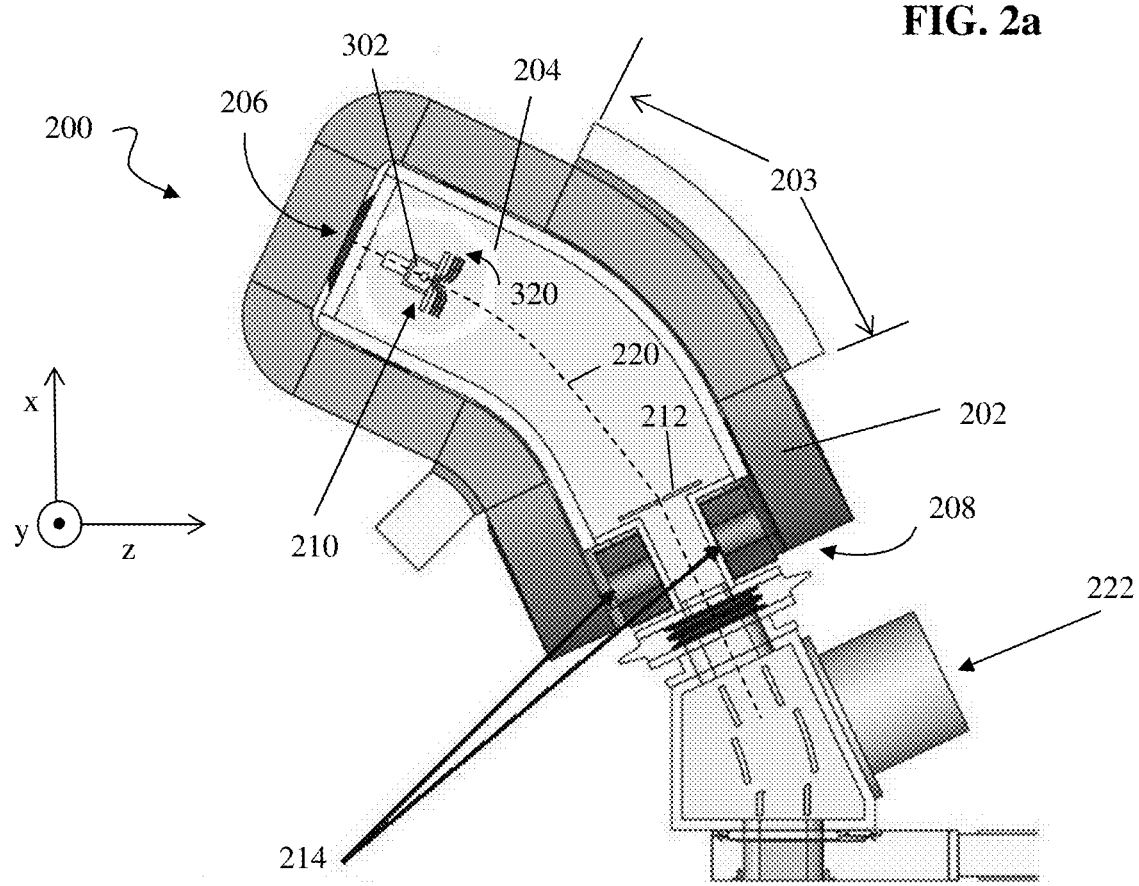

FIGS. 2a and 2b show a perspective view and a top view, respectively, of a portion of an exemplary ion implanter 200, according to some embodiments of the present invention. As shown, the ion implanter 200 includes an analyzer magnet 202 defining a chamber 204 exposed to a magnetic field therein. The chamber 204 of the analyzer magnet 202 provides a curved beam path, along a curved central beam axis 220, between a first end 206 and a second end 208. For example, the chamber 204 of the analyzer magnet 202 can include a bottom wall, a top wall, and multiple side walls that extend between the first end 206 and the second end 208 to define the curved path. The first end 206, which is near the entry of the analyzer magnet 202, represents an upstream end of chamber 204 with respect to ion beam flow. The second end 208, which is near the exit of the analyzer magnet 202, represents a downstream end of the chamber 204 with respect to ion beam flow. In some embodiments, an angle 203 of the curved path is about 40 degrees. In some embodiments, the widths of the chamber 204 perpendicular to the curved central beam axis 220 vary along the curved central beam axis 220 such that the width of the first end 206 is larger than the width of the second end 208.

In the embodiment illustrated in FIG. 2b, an ion source 210 is disposed within the chamber 204 of the analyzer magnet 202 adjacent to the first end 206, where the ion source 210 is configured to generate an ion beam. Specifically, an extraction system 320 of the ion source 210 extracts the ion beam from an ionization chamber 302 of the ion source 210 for propagation through the analyzer magnet chamber 204. In alternative embodiments, the ion source 210 is disposed outside of the analyzer magnet 202 adjacent to the first end 206. The analyzer magnet 202 is configured to bend the ion beam from the ion source 210 (either positioned within the chamber 204 or outside of the chamber 204) along the curved path from the first end 206 to the second end 208 to spatially separate one or more ion species in the ion beam. Generally, at least one of the ion source 210 or a mass resolving slit (MRS) 212 is located within the chamber 204 of the analyzer magnet 202.

In the embodiment of FIG. 2b where the ion source 210 is inside of the analyzer magnet chamber 204, the ion source 210 is substantially immersed in the magnetic field of the analyzer magnet 202, such that the magnetic field of the ion source 210 is shared with that of the analyzer magnet 202. This shared magnetic field is adapted to not only bend the ion beam along the curved path once the ion beam exits from the ion source 210, but also serve as an external magnetic field for the ion source 210 for generating a plasma in the ion source 210. For example, the shared magnetic field can capture ionizing electrons emitted by the ion source 210 (e.g., by an electron gun of the ion source 210), such that the emitted electron life time is extended, the probability of impacting electrons with dopant gas molecules increases, and the efficiency of generating a plasma by the ion source 210 improves. In general, the magnetic field in the chamber 204 of the analyzer magnet 202 can be substantially uniform and/or oriented substantially along a vertical direction (i.e., along the y-axis as labeled in FIG. 2a.) The magnetic field can be about 500 Gauss (G) to about 600 G in strength. In some embodiments, the strength of the magnetic field is adjustable. For example, one or more sections of the chamber 204 can be be shielded with steel shielding to lower its magnetic strength.

Figure 3:
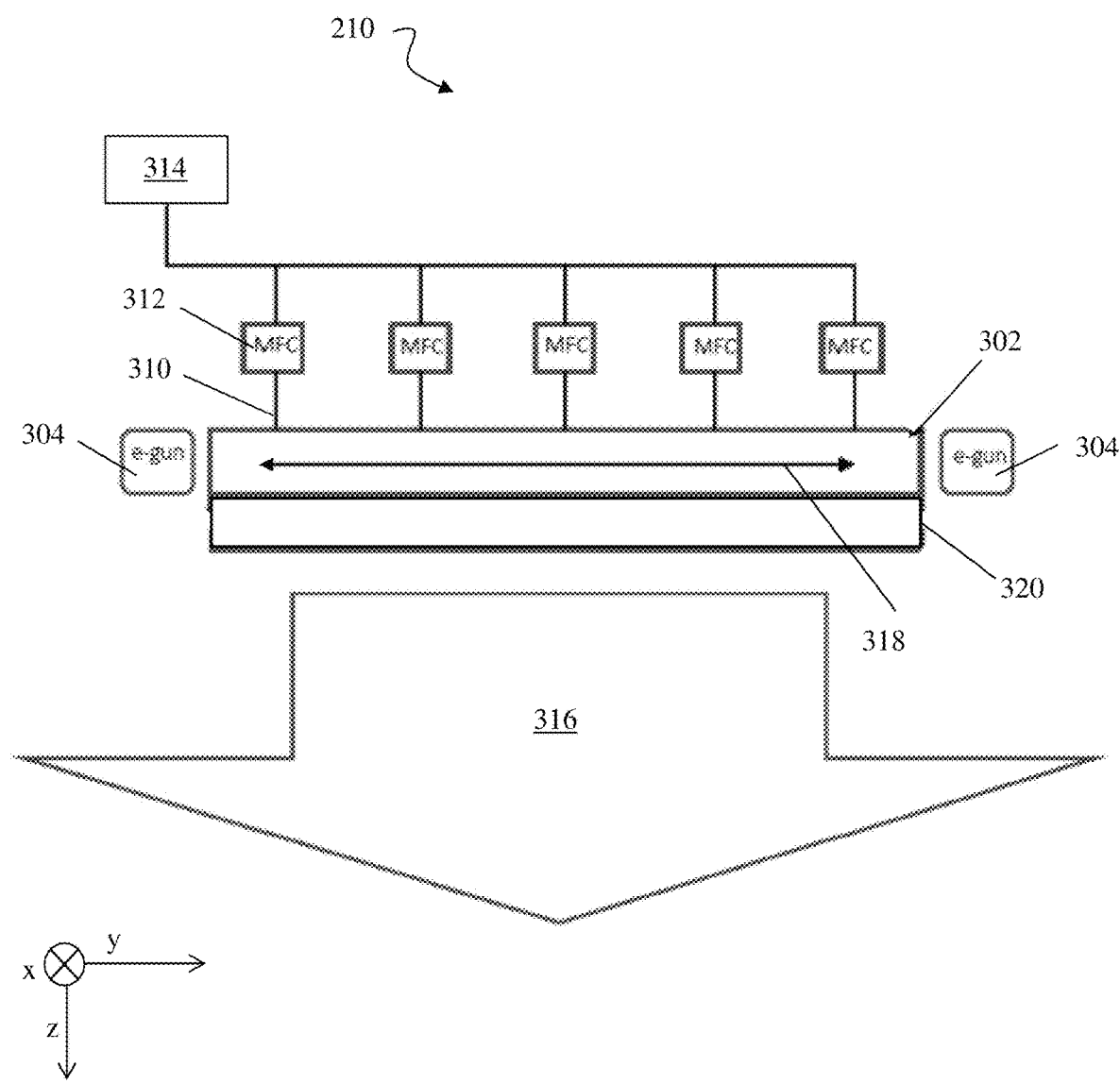
FIG. 3 shows an exemplary structural diagram of the ion source of the ion implanter of FIGS. 2a and 2b, according to some embodiments of the present invention.

The ion source 210 can be configured to produce an ion beam for transport through the analyzer magnet 202 to an ion implantation chamber (not shown) that implants the ion beam into, for example, a semiconductor wafer. In some embodiments, the ion source 210 is generally similar to the ion source described in U.S. Pat. No. 8,994,272, which is owned by the assignee of the instant application and is incorporated herein by reference in its entirety. FIG. 3 shows an exemplary structural diagram of the ion source 210 of the ion implanter 200 of FIGS. 2a and 2b, according to some embodiments of the present invention. As shown, the ion source 210 includes an ionization chamber 302 defining a longitudinal axis 318 along the long dimension of the ionization chamber 302. Specifically, the ionization chamber 302 can be elongated, where the longitudinal axis 318 extends along the elongated length of the ionization chamber 302. The ion source 210 can include a gas delivery system comprising a plurality of gas inlets 310 and a plurality of mass flow controllers (MFCs) 312 that are configured to introduce and control the introduction of a gaseous material from a gas source 314 into the ionization chamber 302. In the ionization chamber 302, a primary plasma forms from the gas molecules that are ionized by electron impact from the electron beam generated by a pair of electron guns 304 positioned on opposing sides of the ionization chamber 302. In some embodiments, the electron guns 304 can also introduce additional ions into the ionization chamber 302. The ions in the ionization chamber 302 can be extracted via an extraction aperture (not shown) and form an energetic ion beam 316 using the extraction system 320. The longitudinal axis 318 can be substantially perpendicular to the direction of propagation of the ion beam 316.

In general, the ionization chamber 302 can have a rectangular shape that is longer in the longitudinal direction 318 than in the traverse direction along the x-axis. The ionization chamber 302 can also have other shapes, such as a cylindrical shape, for example. The length of the ionization chamber 302 along the longitudinal direction 318 may be about 450 mm. The extraction aperture (not shown) can be located on an elongated side of the ionization chamber 302 while each of the electron guns 304 is located at each of the two ends of the elongated side. The extraction aperture can extend along the length of the ionization chamber 302, such as about 450 mm long.

FIGS. 4a and 4b show a top view and a profile view, respectively, of an exemplary configuration of the extraction system 320 of the ion source 210 of FIGS. 2a and 2b, according to some embodiments of the present invention. The extraction system 320, which can be located in the analyzer magnet chamber 204 if the ion source 210 is located in the analyzer magnet chamber 204, includes one or more extraction electrodes, such as a ground electrode 402, a suppression electrode 404, a puller electrode 406 and a plasma electrode 408. These extraction electrodes can be spaced from each other by an insulating material (e.g., 5 mm apart) and oriented substantially parallel along the direction of propagation of the ion beam (i.e., the z axis). As shown, the plasma electrode 408 is closest to the ionization chamber 302, followed by the puller electrode 406, the suppression electrode 404, and the ground electrode 402. Each electrode is generally rectangular in shape with a length in the long dimension being parallel to the longitudinal axis 318 of the ionization chamber 302 (i.e., along the y axis as labeled). The length of each electrode (i.e., along the y-axis) can be substantially the same as the length of the ionization chamber 302.

To extract ions from the ionization chamber 302 and to determine the energy of the implanted ions, the ion source 210 is held at a relatively high positive source voltage by a source power supply (not shown), between 1 kV and 80 kV, for example. In some embodiments, the plasma electrode 408 is electrically connected to the ionization chamber 302 and a bias voltage can be applied to the plasma electrode 408 such that the electrical potential of the plasma electrode 408 is the same as that of the ionization chamber 302. The bias voltage is adapted to affect characteristics of the plasma generated within the ionization chamber 302, such as plasma potential, residence time of the ions, and/or the relative diffusion properties of the ion species within the plasma. The one or more additional electrodes are used to increase extraction efficiency and improve focusing of the ion beam. The extraction electrodes can be held at different potentials. In some embodiments, the ground electrode 402 is held at terminal potential, which is at earth ground unless it is desirable to float the terminal below ground, as is the case for certain implantation systems. The suppression electrode 404 is biased negatively with respect to the ground electrode 402, such as at about −5 kV, to reject or suppress unwanted electrons that otherwise would be attracted to the positively-biased ion source 210 when generating a positively-charged ion beam. The puller electrode 406 is biased positively with respect to the ground electrode 402 at about 20 kV, for example. The plasma electrode 408 is biased positively with respect to the ground electrode 402 at between about 20 kV and 25 kV, for example. Generally, these electrodes can be operated over a broad range of voltages to optimize performance in order to produce a desired ion beam for a particular implantation process.

As shown in FIG. 4*b*, each extraction electrode includes a rectangular frame 410 with a concave rectangular opening 412 centrally located in the frame 410. Multiple discrete rods 414 (e.g., 2 rods) are placed in the concave rectangular opening 412 at discrete intervals such that they form multiple slits 416 (e.g., 3 slits for 2 rods) in the rectangular opening 412 through which an ion beam flows. Each of these rods 414 extends substantially along the length of each electrode and is thus substantially parallel to the longitudinal axis 318 of the ionization chamber 302. Similarly, each of the slits 416 extends substantially along the length of each electrode and is substantially parallel to the longitudinal axis 318 of the ionization chamber 302. Therefore, the extraction system 320 of the ion source 210 is adapted to generate multiple long beam segments for propagation along the z-axis, where the beam segments are parallel along the y-axis. These rods 414 and slits 416 of the extraction electrodes enhance the controllability of the angle of the ion beam extracted, while maintaining the current level in the extracted ion beam. Specifically, even though a large extraction aperture yields an increased quantity of ions that can be extracted from the ionization chamber 302 (thus a higher current associated with the resulting ion beam), a large extraction aperture also generates difficulty in terms of controlling the angle of ion beam extraction. The rods 414 and slits 416 of the extraction electrodes balance these two considerations by optimizing both current yield in the ion beam and controllability of the angle of ion beam extraction.

In some embodiments, the location and size of the rods 414 and slits 416 within the rectangular opening 412 of the frame 410 are substantially the same among the electrodes. In an exemplary configuration, the width (W) of the rectangular opening 412 along the x-axis is about 13 mm and the length (L) of the rectangular opening 412 along the y direction is about 450 mm. In some embodiments, each rod 414 is made from graphite and/or tungsten.

As shown in FIG. 4*b*, for a given extraction electrode, the two ends 418 of each rod 414 are attached to the frame 410 of the electrode. While one end 418 of a rod 414 can be fixed to the frame 410, the other end 418 can be slidable relative to the frame 410. For example, the slidable end 418 of a rod 414 can expand or retract (e.g., along the length of the frame 410) while being attached to the frame 410.

Figure 5:
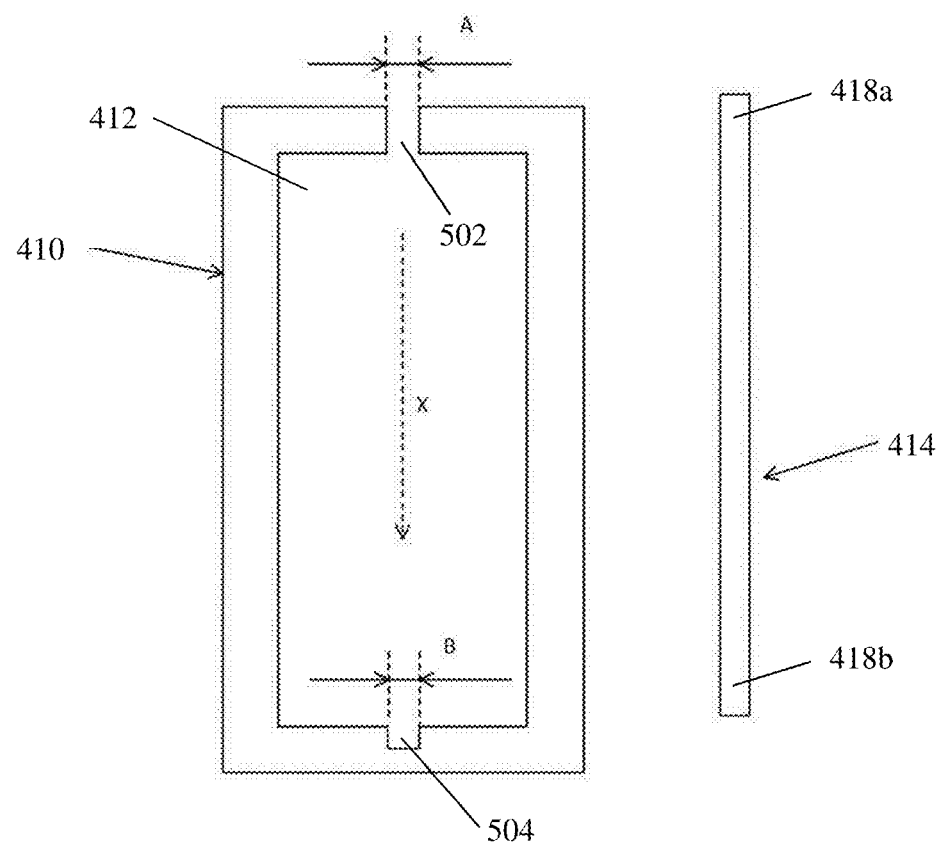
FIG. 5 illustrates an electrode frame of an extraction electrode of FIGS. 4a and 4b that is configured to fixedly engage one end of a rod and slidably engage the other end of the rod, according to some embodiments of the present invention.

FIG. 5 illustrates an electrode frame 410 of an extraction electrode of FIGS. 4*a* and 4*b* that is configured to fixedly engage one end 418*a* of a rod 414 and slidably engage the other end 418*b* of the rod 414, according to some embodiments of the present invention. As explained above, the electrode frame 410 includes the centrally located opening 412, within which the rod 414 is placed. The rod 414 is adapted to extend longitudinally along the length of the electrode frame 410. A first end 418*a* of the rod 414 is adapted to loosely fit into an open groove 502 on the electrode frame 410, where the width A of the open groove 502 is larger than the width of the rod 414 so as to allow the first end 418*a* to slide (e.g., expand or retract) longitudinally along the length of the frame 410. The other end 418*b* of the rod 414 is adapted to tightly fit into a closed groove 504 on the electrode frame 410, where the width B of the second groove 504 is substantially same as or slightly larger than the width of the rod 414. Thus the width A of the open groove 502 is larger than the width B of the closed groove 504 to allow more movement at the first end 418*a* of the rod 414. This design is advantageous because a rod 414 tends to expand during ion source operation due to the large amount of heat generated by the ion source 210. In alternative embodiments, both of the grooves 502 and 504 are closed to fixedly engage the rod 414 at both ends 418*a*, 418*b*. Even though only one rod 414 is illustrated in the extraction electrode embodiment of FIG. 5, additional discrete rods can be located within the electrode frame 410, such as two or more rods 414.

In some embodiments, the cross section of the rod 414 is rectangular (e.g., square), in which case the cross sections of the grooves 502, 504 are also rectangular (e.g., square) in shape to accommodate the rod 414 and secure them to the frame 410. In some embodiments, the cross section of the rod 414 is slightly trapezoidal, in which case the cross sections of the grooves 502, 504 are similarly trapezoidal in shape to accommodate the rod 414 and secure them to the frame 410. Specifically, the shorter base of the trapezoidal cross section of the grooves 502, 504 is located at the surface of the frame 410 while the longer base of the trapezoidal cross section of the grooves 502, 504 is within the frame 410 so as to better retain the rod 414 by preventing the rod 414 from falling out of the frame 410. Other cross sectional shapes for the rod 414 and the grooves 502, 504 are possible, such as a circular cross section.

In some embodiments, the cross section of each rod 414 in the set of discrete rods for the plasma electrode 408 is situated at an angle in relation to the cross section of each rod for the other extraction electrodes, as shown in FIG. 4*a*. The angle can be about 45 degrees. This rotated orientation of the rods 414 for the plasma electrode 408 is adapted to balance and optimize several factors including the strength of the electrodes, the ion beam current and the quality of the extracted ion beam.

Figure 6A:
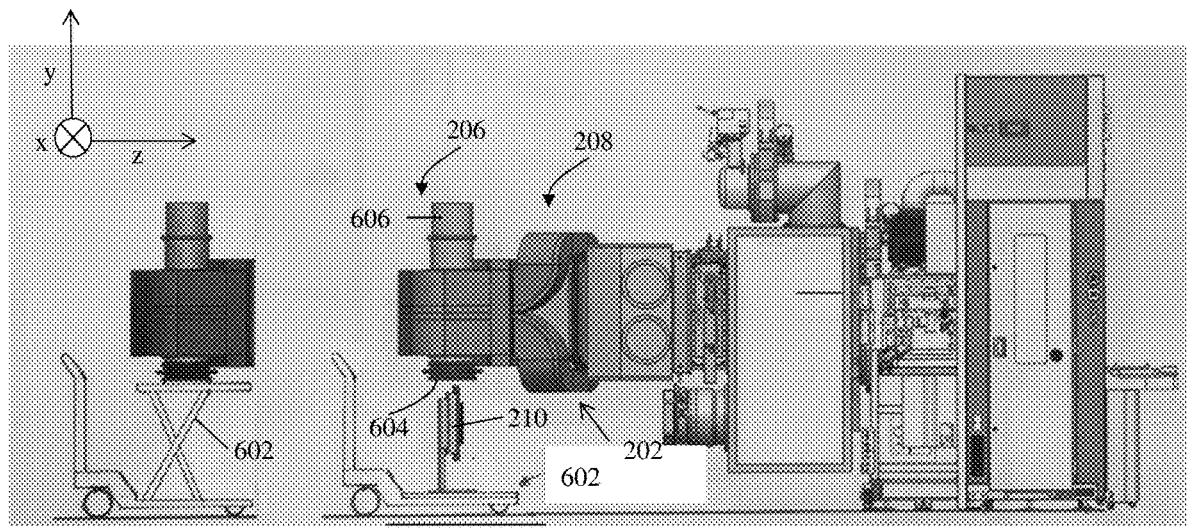
FIGS. 6a-c show exemplary implementations of the ion implanter of FIGS. 2a and 2b configured to receive and remove the ion source from the bottom, top, and side walls of the analyzer magnet, respectively, according to some embodiments of the present invention.
Figure 6B:
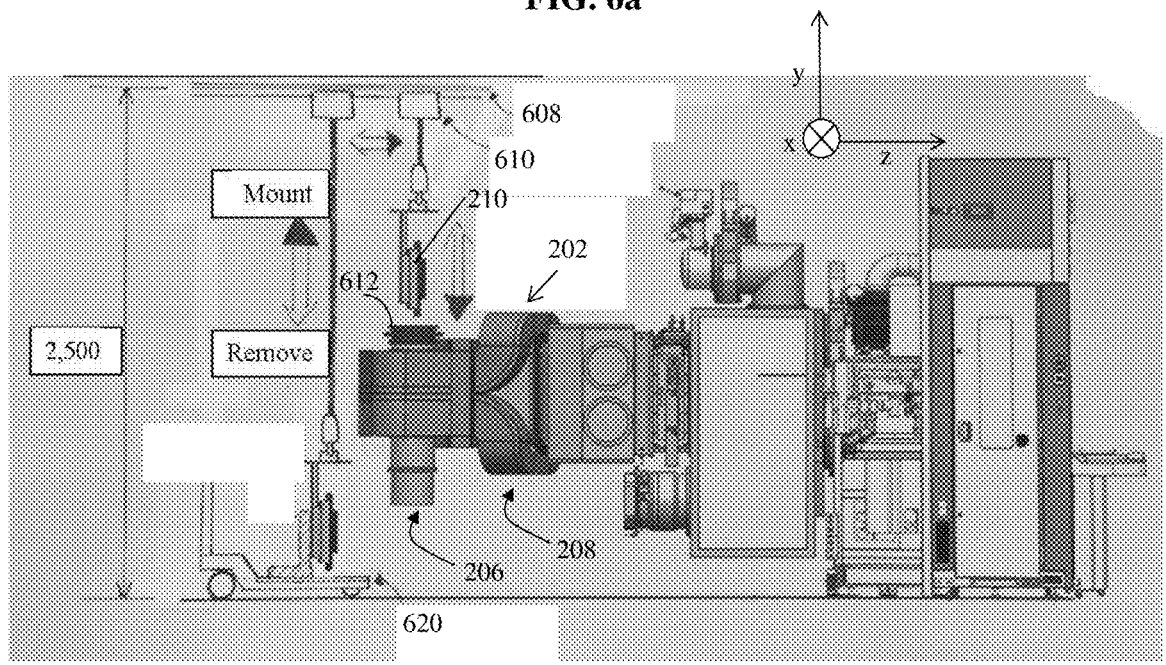
Figure 6C:
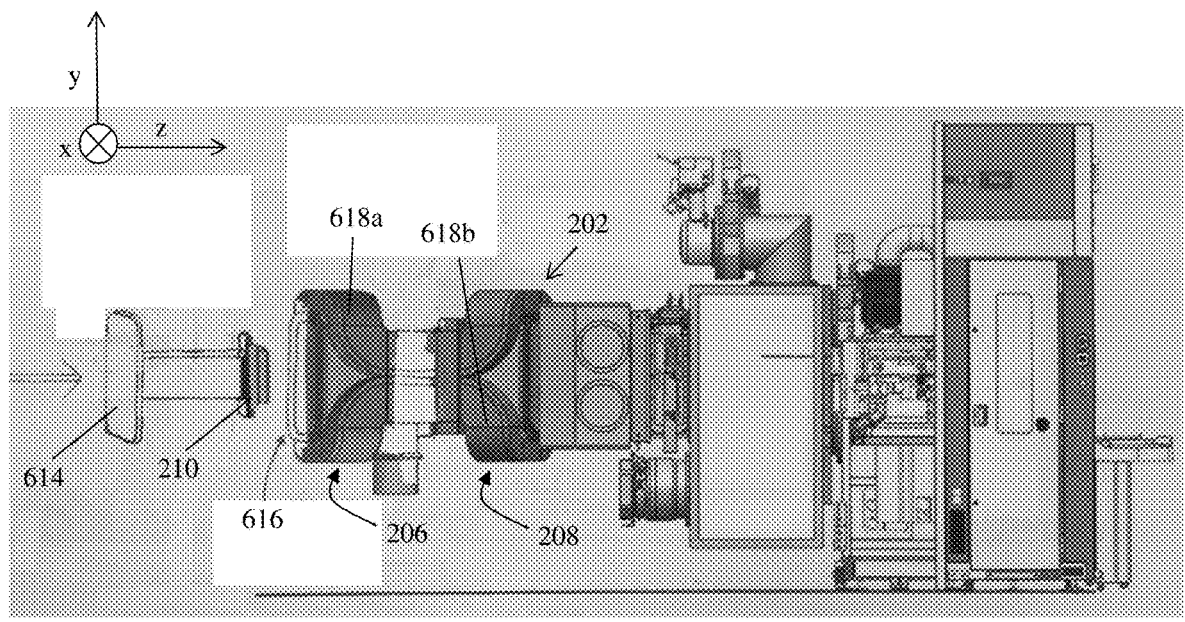

In another aspect, the ion source 210 can be installed into the analyzer magnet 202 in a number of different ways. FIGS. 6*a-c* show exemplary implementations of the ion implanter 200 of FIGS. 2*a* and 2*b* configured to receive and remove the ion source 210 from the bottom, top, and side walls of the analyzer magnet 202, respectively, according to some embodiments of the present invention. As shown in FIG. 6*a*, the ion source 210 is mounted on a lifer 602, which in turn mounts the ion source 210 into or removes the ion source 210 from the analyzer magnet 202 via a bottom port 604 located on the bottom wall of the analyzer magnet 202. The bottom port 604 is situated adjacent to the entry end 206 of the analyzer magnet 202. In operation, the lifter 602 is adapted to translate vertically along the y-axis to mount the ion source 210 into or remove the ion source 210 from the analyzer magnet 202 via the bottom port 604. This bottom mounting and removal configuration has the advantage of preventing flakes falling into a turbo pump 606 of the analyzer magnet 202.

Alternatively, as shown in FIG. 6*b*, the ion source 210 is attached to a tool roof 608 via a hoist crane 610, which in turn mounts the ion source 210 into or removes the ion source 210 from the analyzer magnet 202 via a top port 612 located on the top wall of the analyzer magnet 202. The top port 612 is situated adjacent to the entry end 206 of the analyzer magnet 202. Specifically, the hoist crane 610, which is secured to the tool roof 608, is adapted to translate vertically along the y-axis to mount the ion source 210 into or remove the ion source 210 from the analyzer magnet 202 via the top port 612. In some embodiments, a lifer 620, which can be similar to the lifer 602 of FIG. 6a, is used to position the ion source 210 for proper alignment with the hoist crane 610 before the hoist crane 610 lifts the ion source 210 from the hand lifter 602 and mounts the ion source 210 into the analyzer magnet 202.

Alternatively, as shown in FIG. 6c, the ion source 210 is mounted on a retractable mounting flange 614, which in turn mounts the ion source 210 into or removes the ion source 210 from the analyzer magnet 202 via a side port 616 on a side wall of the analyzer magnet 202. For example, the side port 616 can be located on the side wall where the first/entry end 206 of the analyzer magnet 202 is located. In operation, the mounting flange 614 is adapted to translate laterally along the z-axis (i.e., the direction of propagation of the ion beam) to mount the ion source 210 into or remove the ion source 210 from the analyzer magnet 202 via the side port 616. In some embodiments, the mounting flange 614 and the side port 616 are substantially rectangular in shape. The mounting flange 614 can become a part of the analyzer magnet chamber 204 after installation of the ion source 210 into the chamber 204. For example, the mounting flange 614 can be attached to an external surface of the analyzer magnet chamber 204 to seal the side port 616 once the ion source 210 is inside of the chamber 204. Generally, because the ion source 210 is mounted from the side of the analyzer magnet 202, such arrangement does not interfere with the magnetic coils that are wrapped around the external top and bottom surfaces of the analyzer magnet chamber 204. Hence, as shown, in FIG. 6c, both the entry side 206 and the exit side 208 of the analyzer magnet 202 can be surrounded by magnetic coils 618a, 618b, respectively, that have a conventional saddle shape. In contrast, for the analyzer magnet configurations of FIGS. 6a and 6b, only the magnetic coils at the exit side 208 have a conventional saddle shape.

In some embodiments, installation of the ion source 210 into the analyzer magnet 202 can be automated in any one of the top, bottom or side-mounted configurations of FIGS. 6a-c. For example, positioning data related to the location of the ion source 210 and the locations of equipment for transporting the ion source 210 (e.g., the lifter 602, the tool roof 608, the hoist crane 610, the mounting flange 614, etc) can be programed into and tracked by a computer numerical controller (CNC) for automatically controlling the installation process. Manual operation of the transportation equipment is also possible to install the ion source 210 into the analyzer magnet 202.

Figure 7:
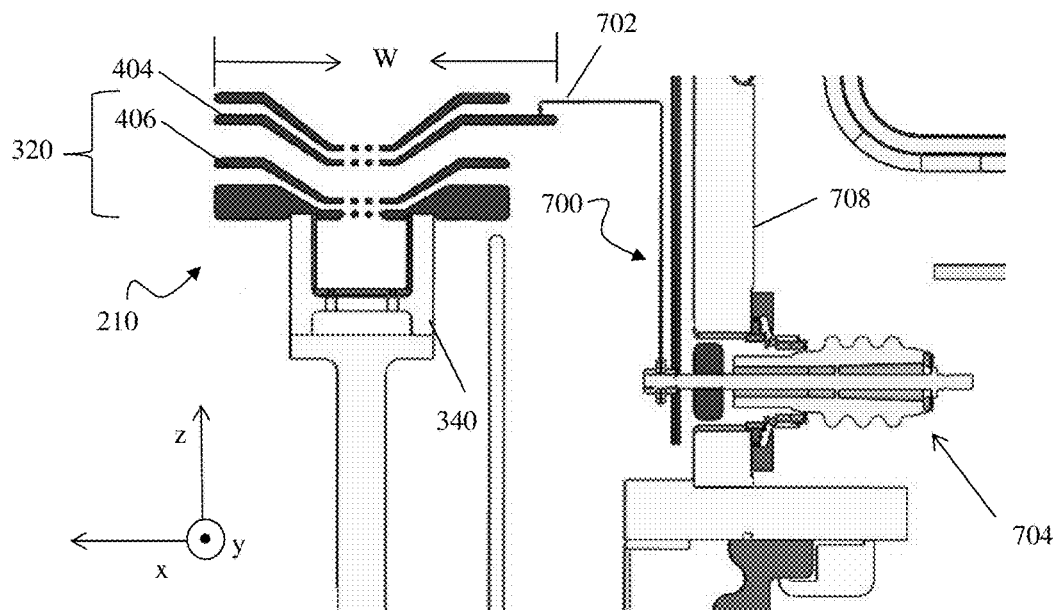
FIG. 7 shows an exemplary biasing assembly for biasing an extraction electrode of the ion source inside of the analyzer magnet of the ion implanter of FIGS. 2a and 2b, according to some embodiments of the present invention.

In another aspect, one or more voltage biasing assemblies are provided to bias one or more electrodes in the extraction system 320 of the ion source 210 outside of the chamber 204 of the analyzer magnet 202, while the ion source 210 is located inside of the chamber 204. FIG. 7 shows an exemplary biasing assembly 700 for biasing an extraction electrode of the ion source 210 positioned inside of the analyzer magnet 202 of the ion implanter 200 of FIGS. 2a and 2b, according to some embodiments of the present invention. In some embodiments, this biasing assembly 700 is compatible with the side-mounted design of the analyzer magnet 202 illustrated in FIG. 6c. That is, this biasing assembly 700 can be used when the ion source 210 is mounted into the analyzer magnet 202 via the side port 616. The biasing assembly 700 includes an elastic conductive member 702 (e.g., a conductive spring) disposed inside of the analyzer magnet chamber 204. One end of the elastic conductive member 702 is configured to physically contact the frame 410 of an extraction electrode, such as that of the suppression electrode 404 or the puller electrode 406. The other end of the elastic conductive member 702 is connected to a voltage feedthrough assembly 704 that is mounted through a side wall 708 of the analyzer magnet chamber 204. The voltage feedthrough assembly 704 is adjustable by an operator outside of the wall 708 to provide a desired amount of voltage to the connected extraction electrode (i.e., the suppression electrode 404 or the puller electrode 406) inside of the analyzer magnet chamber 204 via the elastic conductive member 702.

In some embodiments, if the elastic conductive member 702 extends along the x-axis, the frame 410 of the extraction electrode that is configured to connect to the elastic conductive member 702 has a longer width (w) along the x-axis in comparison to the widths of the other electrode frames so as to facilitate its connection to the elastic conductive member 702. Specifically, because the electrodes in the extraction system 320 are overlapping along the installation direction (i.e., the z-axis), enhancing the x-dimension of the intended electrode ensures that the elastic conductive member 702 only makes physical contact with the intended electrode. However, enlarging the dimension of the intended electrode is not required if the elastic conductive member 702 is located on the top ceiling or bottom floor of the analyzer magnet chamber 204 and extends along the y-axis, in which case the ion source 210 is installed in a direction along the y-axis as illustrated in the installation setup of FIGS. 6a and 6b, for example.

In some embodiments, two biasing assemblies are used to bias both the suppression electrode 404 and the puller electrode 406 simultaneously. Therefore, one elastic conductive member 702 can be connected to the suppression electrode 404 while another elastic conductive member (not shown) can be connected to the puller electrode 406. These elastic conductive members do not need to be located on the same side of the analyzer magnet chamber 204. For example, while the elastic conductive member 702 for the biasing assembly 700 can be located on the right side wall 708 as illustrated, the elastic conductive member of the other biasing assembly (not shown) can be located on the left side wall of the chamber 204, or even top or bottom walls of the chamber 204.

Figure 8:
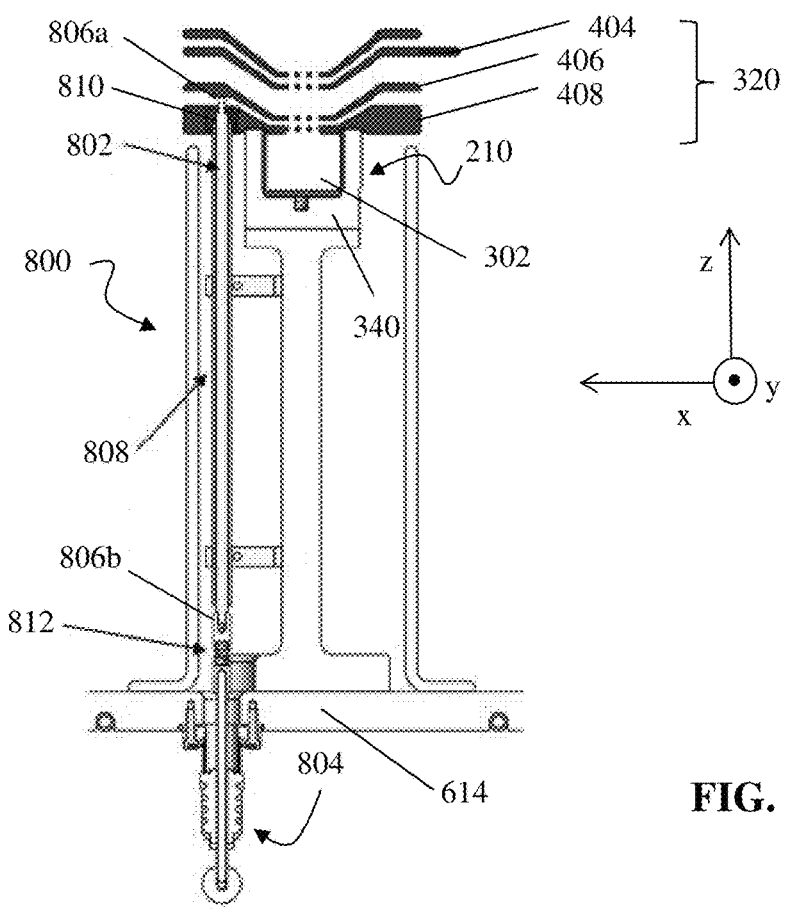
FIG. 8 shows another exemplary biasing assembly for biasing an extraction electrode of the ion source positioned inside of the analyzer magnet of the ion implanter of FIGS. 2a and 2b, according to some embodiments of the present invention.

FIG. 8 shows another exemplary biasing assembly 800 for biasing an extraction electrode of the ion source 210 positioned inside of the analyzer magnet 202 of the ion implanter 200 of FIGS. 2a and 2b, according to some embodiments of the present invention. In some embodiments, this biasing assembly 800 is compatible with the side-mounted design of the analyzer magnet 202 illustrated in FIG. 6c. That is, this biasing assembly 800 can be used when the ion source 210 is mounted into the analyzer magnet 202 via the side port 616 in the direction of the z-axis. The biasing assembly 800 includes a conductive rod 802 (e.g., made of stainless steel) disposed inside of the analyzer magnet chamber 204. The conductive rod 802 has a proximal end 806a that is configured to physically contact the frame 410 of an extraction electrode inside of the chamber 204, such as that of the suppression electrode 404 or the puller electrode 406. The distal end of 806b the conductive rod 802 is connected to a voltage feedthrough assembly 804 that is mounted through a side wall at the first/entry end 206 of of the analyzer magnet chamber 204 (e.g., through the mounting flange 614 covering the side port 616). Thus, the conductive rod 802 extends along the z-axis of the analyzer magnet 202. The voltage feedthrough assembly 804 is adjustable by an operator external to the analyzer magnet chamber 204 to provide a desired amount of voltage to the connected extraction electrode (i.e., the suppression electrode 404 or the puller electrode 406) inside of the chamber 204 via the conductive rod 802. In some embodiments, the conductive rod 802 is surrounded by an insulating material (e.g., placed inside of an alumina guiding tube) such that only the two ends 806a, 806b of the rod 802 are electrically exposed.

In some embodiments, the conductive rod 802 reaches the intended electrode by extending through a hole on each of the other electrode(s) it passes through. For example, as illustrated in FIG. 8, to physically contact the puller electrode 406, the conductive rod 802 passes through a hole 810 on the frame 410 of the plasma electrode 408. Because the conductive rod 802 is surrounded by an insulating guide tube 808, the conductive rod 802 is insulated from the plasma electrode 408 as it passes through the hole 810 and is only conductive with respect to the puller electrode 406.

In some embodiments, an elastic member (e.g., a spring) 812 is located internal to the analyzer magnet chamber 204. The elastic member 812 maintains physical connection with the distal end of 806b of the conductive rod 802 that is located inside of the chamber 204, such that the elastic member 812 imparts a force on the conductive rod 802 in the direction of the z-axis. This force pushes the conductive rod 802 against the extraction electrode to ensure that the conductive rod 802 maintains physical contact with the electrode. Specifically, the physical contact between the intended extraction electrode and the conductive rod 802 can be inconsistent after, for example, assembly of the extraction system 320 into the ionization chamber 302. If this occurs, it would be impossible to apply a voltage to an extraction electrode of the extraction system 320 via the conductive rod 802. Thus, the elastic member 812 ensures proper positioning of the conductive rod 802 with the intended extraction electrode for the purpose of maintaining a good electrical connection for setting a voltage to the electrode. Specifically, the elastic member 812 physically ensures that contact between the intended electrode and the conductive rod 802 is automatically maintained when an operator assembles the extraction system 320 into the ion source chamber 340.

In general, these voltage biasing assemblies 700, 800 facilitate maintenance of the ion source 210 that is installed within an ion source chamber 340. By establishing certain connections to the ion source 210 using, for example, the elastic conductive member 702 of the biasing assembly 700 of FIG. 7 or the conductive rod 802 of the biasing assembly 800 of FIG. 8 and allowing these connections to be adjusted external to the ion source chamber 340 and/or the analyzer magnet chamber 204 or automatically adjusted upon installation, an operator no longer needs to enter the ion source chamber 340 for maintenance. Specifically, by connecting at least one of the puller electrode 406 or the suppression electrode 404 to the voltage biasing assembly 700 or 800, the voltage of each electrode can be set without entering the ion source chamber 340. Therefore, the ion source chamber 340 can be downsized in comparison to that of a conventional ion source.

Figure 1:
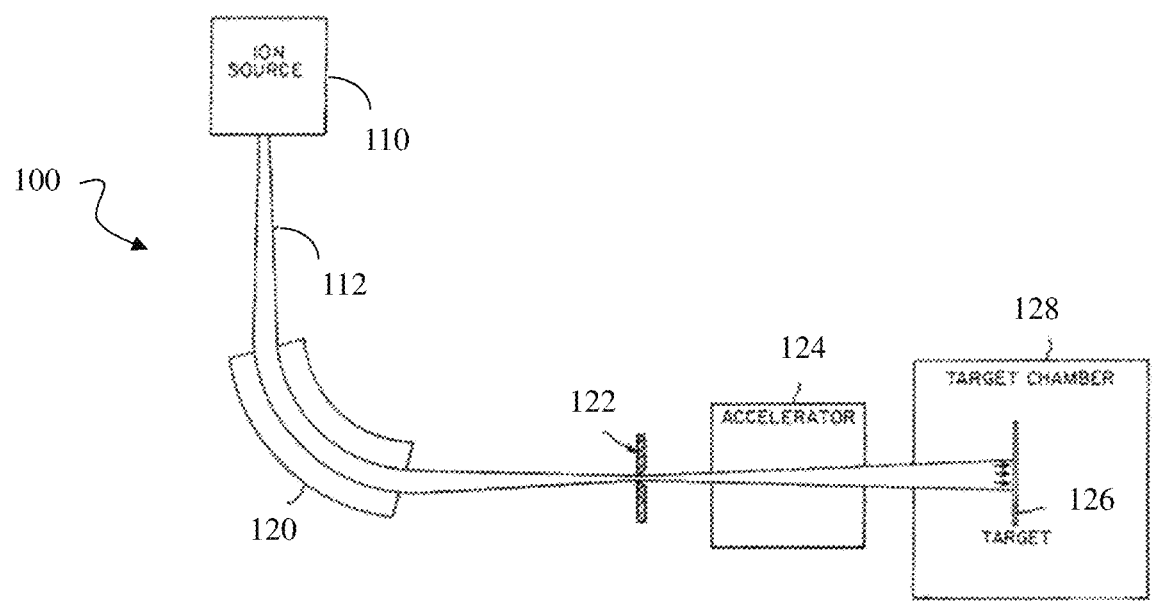
FIG. 1 shows a schematic diagram of a traditional, prior art ion implanter.

With continued reference to FIGS. 2a and 2b, in some embodiments, the analyzer magnet 202 includes the mass resolving slit (MRS) 212 that is located within the analyzer magnet chamber 204 adjacent to the second/exit end 208. As shown, the MRS 212 is located in the analyzer magnet chamber 204 downstream from the ion source 210. One of the advantages of locating the MRS 212 inside of the analyzer magnet 202 is that the beam path from the ion source 210 to the workpiece (not shown) becomes shorter in comparison to a conventional ion implanter, such as the ion implanter 100 of FIG. 1, where the MRS 122 is placed external to the analyzer magnet 120.

In some embodiments, the analyzer magnet 202 includes the one or more focusing lenses 214 having at least a portion located outside of the analyzer magnet chamber 204 adjacent to the second/exit end 208, which can be narrower than the first/entry end 206. For example, the one or more focusing lenses 214 can be positioned entirely outside of the second end 208. Specifically, at least a portion of the focusing lenses 214 is place outside of the analyzer magnet chamber 204 downstream from the MRS 212 to focus, defocus or wiggle the ion beam from the MRS 212 in a non-dispersive plane. Generally, a dispersive plane is defined as the plane where an ion beam is deflected by an analyzer magnet.

Figure 9:
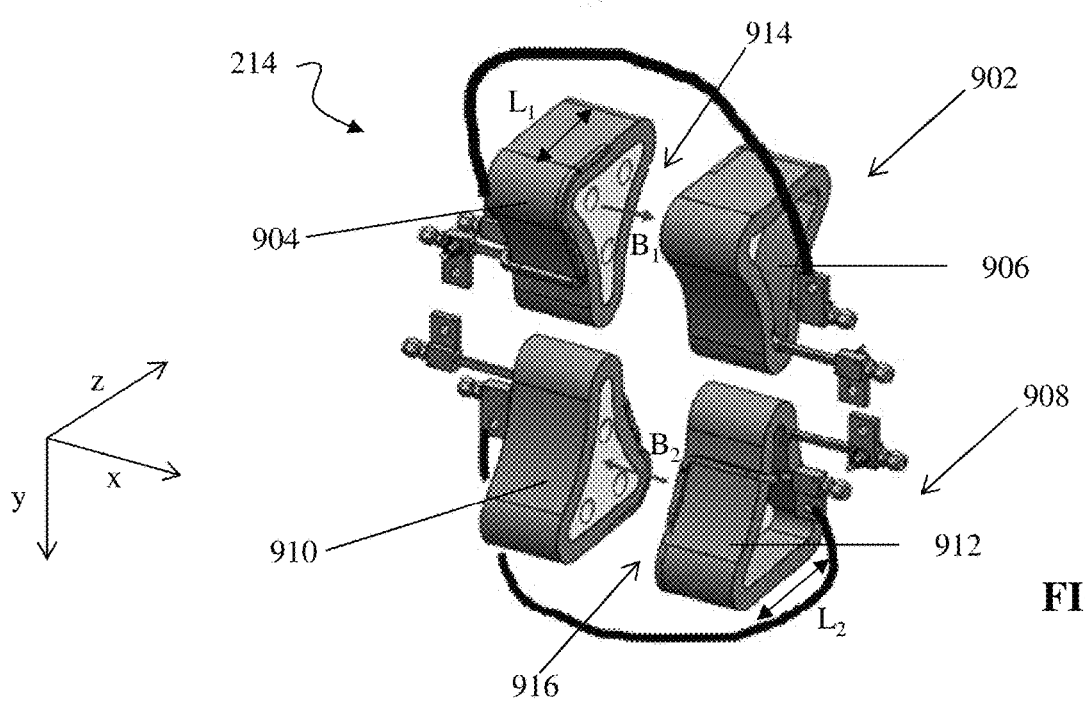
FIG. 9 shows an exemplary configuration of the focusing lenses of the ion implanter of FIGS. 2a and 2b, according to some embodiments of the present invention.

FIG. 9 shows an exemplary configuration of the focusing lenses 214 of the ion implanter 200 of FIGS. 2a and 2b, according to some embodiments of the present invention. The focusing lenses 214 comprises an upper zone including an upper magnetic coil pair 902 having a pair of magnetic coils 904, 906 that are opposed to each other in the x direction and cover substantially the upper half of the ion beam in the y direction. The focusing lenses 214 also comprises a lower zone including a lower magnetic coil pair 908 having a pair of magnetic coils 910, 912 that are opposed to each other in the x direction and cover substantially the lower half of the ion beam in the y direction. The upper magnetic coils 904, 906 are connected in series and excited by a DC power source (not shown) to generate a magnetic field $B_1$ along the x direction as shown in FIG. 9. The lower magnetic coils 910, 912 are connected in series and excited by a DC power source (not shown) to generate a magnetic field $B_2$ along the x direction, but opposite of the magnetic field $B_1$, as shown in FIG. 9. In alternative embodiments, the same power source is used to excite both the upper and lower magnetic coil pairs 902, 908. In the focusing lenses 214, the the magnetic fields $B_1$, $B_2$ are opposite to each other and are generated in the gap 914 between the upper magnetic coil pair 902 and the gap 916 between the lower magnetic coil pair 908, respectively. The ion beam is adapted to propagate in the z direction in the gaps 914, 916. In some embodiments, no steel yokes are used for the upper and lower magnetic coil pairs 902, 908 so as to not disturb the magnetic field of the analyzer magnet 202.

In some embodiments, physical and/or electrical parameters of the upper magnetic coil pair 902 and/or the lower magnetic coil 908 are independently adjusted to focus, defocus or wiggle the ion beam in the y direction. For example, the lengths of the upper magnetic coil pair 902 ($L_1$) and the length of the lower magnetic coil pair 908($L_2$) or the amount and/or direction of the current applied to the pairs 902, 908 can be independently adjusted to focus, defocus or wiggle the ion beam in the y direction. In some embodiments, the current flow and/or winding direction of the coil pair 902 or 908 determines the direction of the resulting magnetic fields $B_1$, $B_2$, which determines the deflection direction of the ion beam (i.e., divergent from or convergent toward the central beam axis 220). In some embodiments, the amount of current applied to the coil pair 902 or 908 determines the degree of divergence or convergence.

Figure 10:
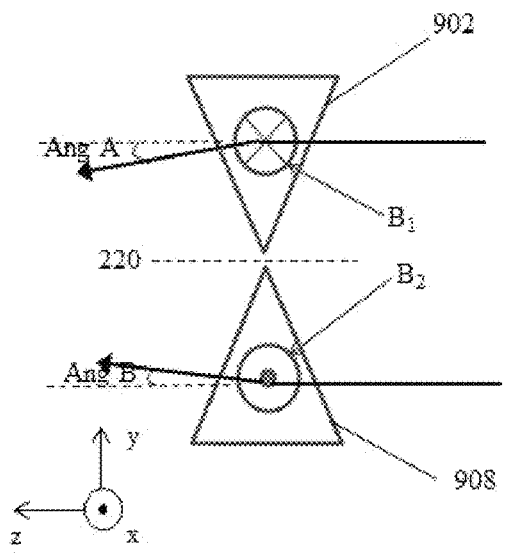
FIG. 10 illustrates a configuration of the focusing lenses of FIG. 9 for focusing an incident ion beam, according to some embodiments of the present invention.

FIG. 10 illustrates a configuration of the focusing lenses 214 for focusing an incident ion beam in the y direction such that the outgoing ion beam is convergent in the y direction in comparison to the incident ion beam, according to some embodiments of the present invention. In some embodiments, the current applied to the upper and lower magnetic coil pairs 902, 908 are about the same amount, which causes the ion beam to bend symmetrically in the y direction toward the central beam axis 220 as the ion beam travels through the focusing lenses 214. In some embodiments, the angle of convergence (angle A) by the upper magnetic coil pair 902 and the angle of convergence (angle B) by the lower magnetic coil pair 908 are substantially the same. In some embodiments, the central beam axis 220 for the incident ion beam and the outgoing ion beam remains the same. Operating the lenses 214 to focus an incident ion beam provides control over the angle of propagation of the ion beam, which can be used, for example, to change a divergent incident ion beam to a parallel outgoing beam.

Figure 11:
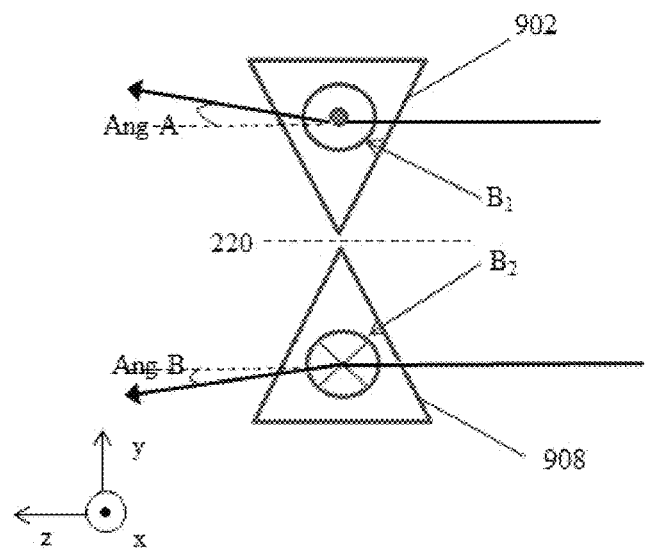
FIG. 11 illustrates a configuration of the focusing lenses of FIG. 9 for defocusing an incident ion beam, accordingly to some embodiments of the present invention.

FIG. 11 illustrates a configuration of the focusing lenses 214 for defocusing an incident ion beam in the y direction such that the outgoing ion beam is divergent in the y direction in comparison to the incident ion beam, accordingly to some embodiments of the present invention. In the defocusing example of FIG. 11, the directions of the currents flowing through the coils 904, 906, 910, 912 can be made opposite to those of the above-described focusing example of FIG. 10 by reversely connecting the DC power sources so that the directions of the magnetic fields $B_1$, $B_2$ are opposite to those of the focusing example of FIG. 10. However, the directions of the magnetic fields $B_1$, $B_2$ in FIG. 11 remain opposite to each other. Such reversal in the directions of the magnetic fields $B_1$, $B_2$ in comparison to those in the focusing configuration of FIG. 10 causes the ion beam to become divergent such that it separates outward (instead of bends inward) in the y direction from the central beam axis 220 as the ion beam travels through the focusing lenses 214. In some embodiments, the angle of divergence (angle A) by the upper magnetic coil pair 902 and the angle of divergence (angle B) by the lower magnetic coil pair 908 are substantially the same due the same amount of current applied to the upper and lower magnetic coil pairs 902, 908. In some embodiments, the central beam axis 220 for the incident ion beam and the outgoing ion beam remains the same. Operating the lenses 214 to defocus an incident ion beam provides control over the angle of propagation of the ion beam, which can be used, for example, to change a convergent incident ion beam to a parallel outgoing beam.

Figure 12A:
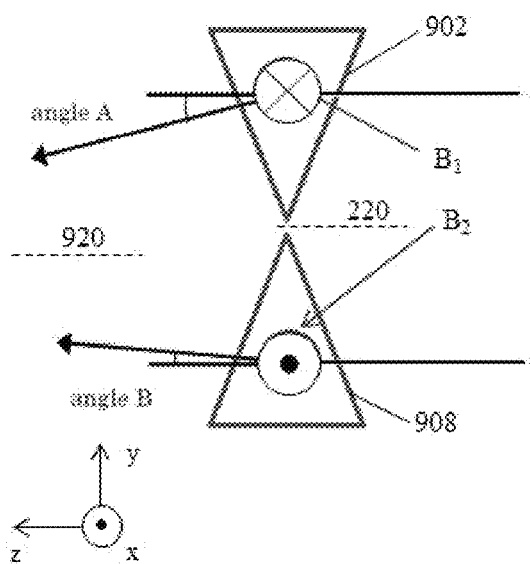
FIGS. 12a and 12b illustrate a configuration of the focusing lenses of FIG. 9 for wiggling an incident ion beam, accordingly to some embodiments of the present invention.
Figure 12B:
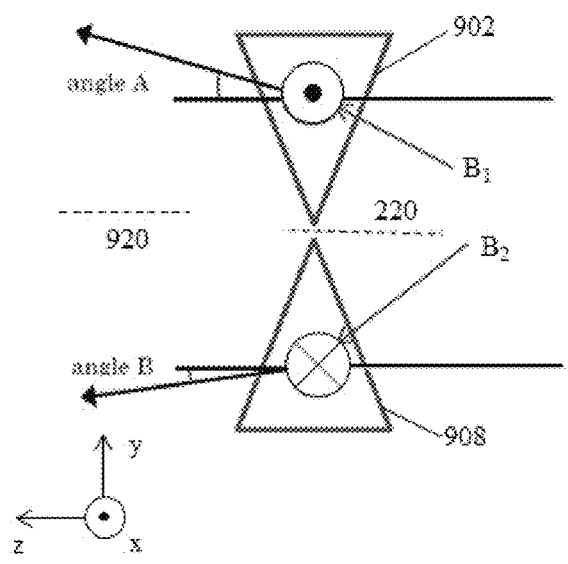

FIGS. 12a and 12b illustrate a configuration of the focusing lenses 214 for wiggling an incident ion beam in the y direction that simultaneously shifts the central beam axis of the ion beam while adjusts the angle of propagation of the ion beam (i.e., focusing or defocusing the ion beam), accordingly to some embodiments of the present invention. Generally, different amount and direction of coil current can be applied to the upper magnetic coil pair 902 and the lower magnetic coil pair 902 to cause the outgoing ion beam to become either (i) focused/convergent—asymmetrically bending inward in the y direction as the ion beam travels through the focusing lenses 214 or (ii) defocused/divergent—asymmetrically bending outward in the y direction as the ion beam travels through the focusing lenses 214. Further, due to the difference in the coil current applied, the angle of convergence or divergence by the upper magnetic coil pair 902 (angle A) is different than the angle of convergence or divergence by the lower magnetic coil pair 908 (angle B), which causes the central beam axis 920 for the outgoing ion beam to shift in the y-direction in relation to the central beam axis 220 for the incident ion beam.

As illustrated in FIG. 12a, the outgoing ion beam is convergent in relation to the incident ion beam because the directions of magnetic fields $B_1$, $B_2$ are the same as those in the example of FIG. 10. In addition, due to the different amounts of current applied to the upper and lower coil pairs 902, 908, the angle of convergence by the upper magnetic coil pair 902 (angle A) is greater than the angle of convergence by the lower magnetic coil pair 908 (angle B), this causes the central beam axis 920 for the outgoing beam to shift downward in the y-direction in relation to the central beam axis 220 for the incident beam. As illustrated in FIG. 12b, the outgoing ion beam is divergent in relation to the incident ion beam because the directions of magnetic fields $B_1$, $B_2$ are the same as those in the example of FIG. 11. In addition, due to the different amounts of current applied to the upper and lower coil pairs 902, 908, the angle of divergence by the upper magnetic coil pair 902 (angle A) is greater than the angle of convergence by the lower magnetic coil pair 908 (angle B), this causes the central beam axis 920 for the outgoing beam to shift upward in the y-direction in relation to the central beam axis 220 for the incident beam. Specifically, in the example of FIG. 12b, the directions of the currents flowing through the coils 904, 906, 910, 912 can be made opposite to those of the example of FIG. 12a by reversely connecting the DC power sources so that the directions of the magnetic fields $B_1$, $B_2$ are opposite to those of the example of FIG. 12a, which changes the ion beam from being divergent to being convergent. However, the directions of the magnetic fields $B_1$, $B_2$ in FIG. 12b remain opposite to each other.

In other embodiments, by suitably adjusting the amounts of coil current in the upper and/or lower magnet coil pairs 902, 908, angle A can be set to be less than angle B, which in turn shifts the central beam axis 920 for the outgoing beam in relation to the central beam axis 220 for the incident beam (i.e., upward for the example of 12a and downward for the example 12b). Even though the examples of FIGS. 10-12b show that the incident ion beam in the y-direction is parallel when entering the focusing lenses 214, in other embodiments, the incident ion beam does not need to be parallel. For example, the incident ion beam can be divergent or convergent, and the focusing lenses 214 can suitably focus or defocus the incident ion beam to generate a parallel outgoing ion beam. In some embodiments, the beam profile downstream from the focusing lenses 214 is monitored to provide feedback for adjusting the coil current of the focusing lenses 214 in order to adjust the ion beam profile to a desired shape.

With continued reference to FIGS. 2a and 2b, in some embodiments, the ion implanter 200 includes a beam deceleration and energy filter 222 located external from and downstream to the chamber 204 of the analyzer magnet 202 adjacent to the chamber's second end 208. The beam deceleration and energy filter 222 is generally configured to change the energy of the ion beam from the analyzer magnet chamber 204, such as reducing the ion beam energy from a high energy level (e.g. about 25 keV) to a lower energy level (e.g., about 3 keV). In addition, the beam deceleration and energy filter 222 can also bend the ion beam, which separates neutral particles from the ion beam.

Figure 13:
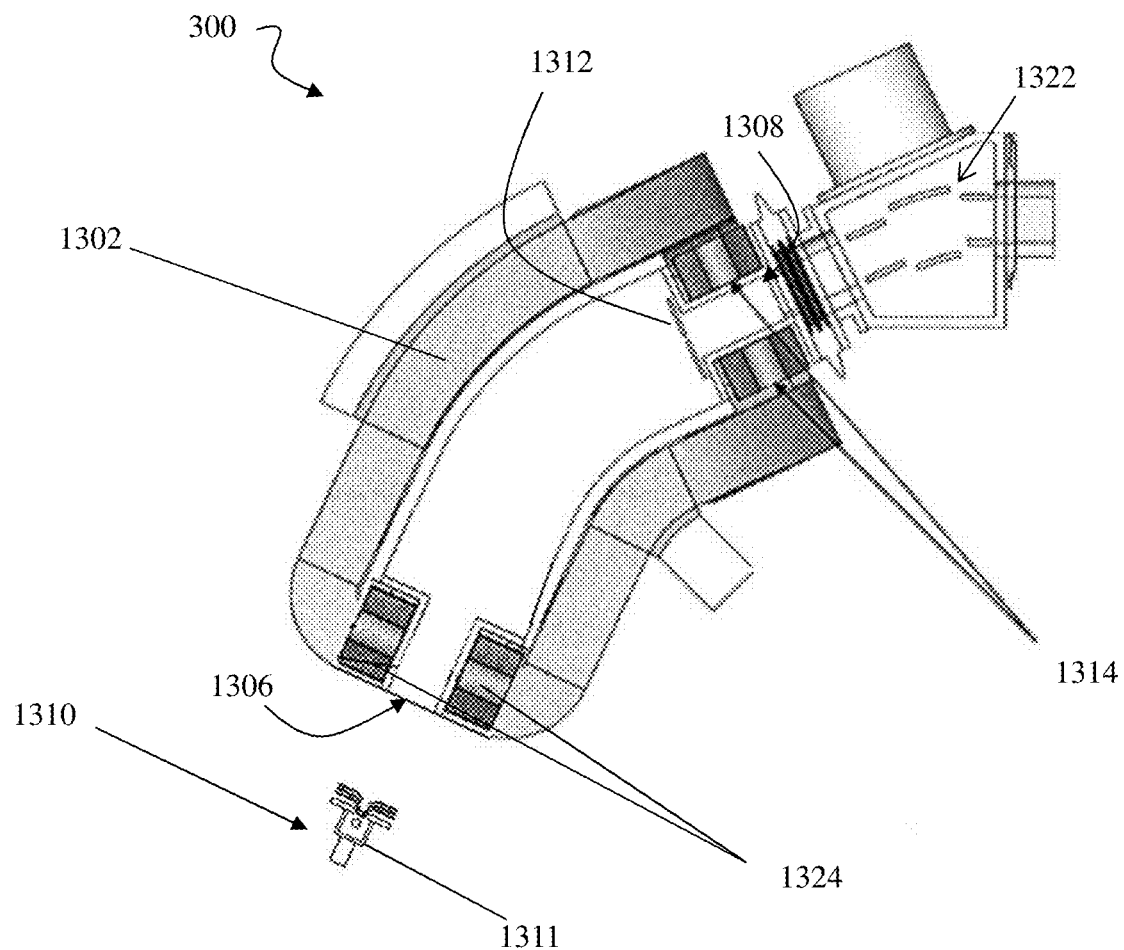
FIG. 13 shows the configuration of another exemplary ion implanter, where the ion source is located outside of the analyzer magnet, according to some embodiments of the present invention.

In another aspect, FIG. 13 shows the configuration of another exemplary ion implanter 300, where the ion source 1310 is located outside of the analyzer magnet 1302, according to some embodiments of the present invention. In general, the ion implanter 300 is substantially the same as the ion implanter 200 of FIGS. 2a and 2b, except for the placement of the ion source 1310 outside of the analyzer magnet 1302. Specifically, the ion source 1310 is located upstream from the analyzer magnet 302 adjacent to the first end 1306 of the analyzer magnet 1302, such that that the ion source 1310 provides an extracted ion beam to the analyzer magnet 1302 for processing and transporting to a workpiece (not shown). As shown, the ion source 1310 is installed inside a vacuum ion source chamber 1311 and surrounded by a source magnet (not shown) for generating a magnetic field in the ion source 1310.

The ion source 1310 can be substantially the same as the ion source 210 described above with reference to FIGS. 3-5, 7 and 8. For example, the ion source 1310 can include the extraction system 320 with one or more biasing assemblies 700, 800 connected to one or more of the extraction electrodes of the extraction system 320. Because the ion source 1310 is not installed inside of the analyzer magnet 1302, the feedthrough assembly 704 of the biasing assembly 700 and/or the feedthrough assembly 804 of the biasing assembly 800 (including the elastic member 812) can be mounted on the ion source chamber 1311 in a similar fashion as mounting on the walls of the analyzer magnet 202 explained above. Thus, the elastic conductive member 702 of the biasing assembly 700 is connected to the ion source chamber 1311 and the conductive rod 802 of the biasing assembly 800 is also connected to the ion source chamber 1311.

The analyzer magnet 1302 can include substantially the same components as the as the analyzer magnet 202, except for the inclusion of an ion source. In some embodiments, the analyzer magnet 1302 includes a MRS 1312 that is about the same in structure, function and location as the MRS 212. The ion implanter 300 can also include a set of focusing lenses 1314 (with at least a portion of which disposed outside of the analyzer magnet 1302 adjacent to the second end 1308) that are about the same in structure, function and location as the focusing lenses 214 described above with reference to FIGS. 9-12b. In some embodiments, the ion implanter 300 includes another set of one or more focusing lenses 1324 positioned outside of the analyzer magnet 1302 at its first end 1306, where the second set of focusing lenses 1324 have substantially the same structure and function as the focusing lenses 1314. The MRS 1312 can be located between the set of focusing lenses 1314 and the set of focusing lenses 1324. In some embodiments, the ion implanter 300 also includes a beam deceleration and energy filter 1322 that has about the same structure, function and location as the deceleration and energy filter 222.

The ion implanters 200, 300 of the present invention have several advantages. Due to the placement of at least one of an ion source or MRS inside of the analyzer magnet, the ion beam path length is shorter in comparison to a conventional ion implanter, such as the ion implanter 100 of FIG. 1. In addition, for the ion implanter 200 with the ion source 210 inside of the analyzer magnet 202, the ion beam of the ion implanter 200 is more stable during transport due to the higher magnetic field provided by the analyzer magnet 202. Thus, the current levels in the ion beams generated by the ion implanters 200, 300 are higher (e.g., about 30% higher) than that of a conventional implanter.

One skilled in the art will realize the invention may be embodied in other specific forms without departing from the spirit or essential characteristics thereof. The foregoing embodiments are therefore to be considered in all respects illustrative rather than limiting of the invention described herein. Scope of the invention is thus indicated by the appended claims, rather than by the foregoing description, and all changes that come within the meaning and range of equivalency of the claims are therefore intended to be embraced therein.

What is claimed:

1. An ion implanter comprising:
   an ion source including:
      a gas source for supplying a gas;
      an ionization chamber defining a longitudinal axis extending therethrough and including an exit aperture along a side wall of the ionization chamber, the ionization chamber adapted to form a plasma from the gas, wherein the plasma generates a plurality of ions; and
      two or more extraction electrodes at the exit aperture of the ionization chamber for extracting the plurality of ions from the ionization chamber in the form of an ion beam, at least one of the extraction electrodes comprising a set of discrete rods forming a plurality of slits in the at least one extraction electrode from which the ion beam is extracted as multiple beam segments, the plurality of slits are configured to enable at least one of increasing a current of the ion beam or controlling an angle of extraction of the ion beam from the ionization chamber, wherein each rod in the set of discrete rods extends along an axis parallel to the longitudinal axis of the ionization chamber; and
   an analyzer magnet having a curved chamber with a bottom wall, a top wall, and multiple side walls defining a curved path between a first end and a second end of the analyzer magnet chamber, each of the bottom, top and side walls at least partially surrounded by magnetic coils to bend the beam segments along the curved path and deflect the beam segments in a dispersive plane, the side walls intersect the dispersive plane,
   wherein each of the plurality of slits is elongated to extend over substantially a length of an opening of each of the two or more corresponding extraction electrodes and the length being (i) substantially parallel to the longitudinal axis of the ionization chamber, (ii) perpendicular to the dispersive plane of the analyzer magnet, and (iii) longer than a width of the opening that is perpendicular to the length and parallel to the dispersive plane, such that the beam segments are deflected in the dispersive plane of the analyzer magnet, the dispersive plane being substantially parallel to the width of the opening; and
   wherein the two or more extraction electrodes include a plasma electrode and a second extraction electrode, a first cross section of each rod in the set of discrete rods for the plasma electrode is situated at a rotated angle that is different from the angle at which the a second cross section of each rod in a set of discrete rods for the second extraction electrode is situated, the first and second cross sections having the same shape.

2. The ion implanter of claim 1, wherein one end of each rod in the set of discrete rods for the at least one extraction electrode is fixed and another end of each rod in the set of discrete rods is slideable.

3. The ion implanter of claim 2, wherein the same shape of the first and second cross sections is square.

4. The ion implanter of claim 1, wherein the angle is about 45 degrees.

5. The ion implanter of claim 1, wherein at least one of the two or more extraction electrodes is configured to physically contact a conductive elastic member connected to a vacuum chamber within which the ion source is installed, the conductive elastic member configured to set a voltage of the at least one electrode.

6. The ion implanter of claim 5, wherein the at least one electrode is a suppression electrode or a puller electrode.

7. The ion implanter of claim 1, wherein at least one of the two or more extraction electrodes is configured to physically contact a conductive rod connected to a vacuum chamber within which the ion source is installed, the conductive rod configured to set a voltage of the at least one electrode.

8. The ion implanter of claim 7, wherein the at least one electrode is a suppression electrode or a puller electrode.

9. The ion implanter of claim 7, wherein a first end of the conductive rod is in physical contact with the at least one electrode and a second end of the conductive rod is in communication with a spring assembly configured to adjust a position of the at least one electrode by imparting a force on the at least one electrode via the conductive rod.

10. The ion implanter of claim 1, wherein the ion source is located external to the analyzer magnet adjacent to the first end.

11. The ion implanter of claim 1, wherein the analyzer magnet comprises a mass resolving slit disposed in the chamber and adjacent to the second end.

12. The ion implanter of claim 11, wherein the analyzer magnet comprises a magnetic focusing lens having at least a portion disposed outside of the chamber, the magnetic focusing lens configured to focus, defocus or wiggle the ion beam in a non-dispersive plane after the ion beam passes through the mass resolving slit.

13. The ion implanter of claim 12, wherein the magnetic focusing lens comprises an upper zone having a pair of upper magnetic coils and a lower zone having a pair of lower magnetic coils.

14. The ion implanter of claim 13, wherein the chamber of the analyzer magnet defines a curved central beam axis, and widths of the chamber perpendicular to the curved central beam axis vary along the curved central beam axis such that a width of the first end is larger than a width of the second end.

15. The ion implanter of claim 14, wherein the magnetic focusing lens is located adjacent to the narrower second end.

16. The ion implanter of claim 14, wherein a second magnetic focusing lens is disposed outside of the chamber of the analyzer magnet adjacent to the first end.

17. The ion implanter of claim 16, wherein the mass resolving slit is located between the first magnetic focusing lens and the second magnetic focusing lens.

18. The ion implanter of claim 13, wherein at least one of applied current or a magnetic field direction of the pair of upper magnetic coils or the pair of lower magnetic coils is adjustable to provide the focus, defocus or wiggle function.

19. The ion implanter of claim 1, wherein the ionization chamber is elongated and the longitudinal axis extends along an elongated length of the ionization chamber.

* * * * *